United States Patent
Cheng et al.

(10) Patent No.: US 12,237,017 B2
(45) Date of Patent: Feb. 25, 2025

(54) METHOD FOR ERASING FLASH MEMORY

(71) Applicant: Winbond Electronics Corp., Taichung (TW)

(72) Inventors: Lung-Chi Cheng, Taichung (TW);
Ying-Shan Kuo, Taichung (TW);
Jun-Yao Huang, Taichung (TW);
Ju-Chieh Cheng, Taichung (TW);
Yu-Cheng Chuang, Taichung (TW)

(73) Assignee: Winbond Electronics Corp., Taichung (TW)

( * ) Notice: Subject to any disclaimer, the term of this patent is extended or adjusted under 35 U.S.C. 154(b) by 162 days.

(21) Appl. No.: 18/072,723

(22) Filed: Dec. 1, 2022

(65) Prior Publication Data
US 2023/0274782 A1    Aug. 31, 2023

(30) Foreign Application Priority Data
Feb. 25, 2022 (TW) .................. 111106910

(51) Int. Cl.
*G11C 16/34* (2006.01)
*G11C 16/16* (2006.01)

(52) U.S. Cl.
CPC .......... *G11C 16/16* (2013.01); *G11C 16/3431* (2013.01); *G11C 16/3445* (2013.01)

(58) Field of Classification Search
CPC . G11C 16/16; G11C 16/3431; G11C 16/3445; G11C 16/08; G11C 16/3409
See application file for complete search history.

(56) References Cited

U.S. PATENT DOCUMENTS

| | | | |
|---|---|---|---|
| 6,088,264 A | 7/2000 | Hazen et al. | |
| 8,958,249 B2 | 2/2015 | Dutta et al. | |
| 9,786,378 B1 * | 10/2017 | Zhang | G11C 16/0483 |
| 11,443,812 B2 * | 9/2022 | Stoller | G11C 16/349 |
| 11,551,765 B2 * | 1/2023 | Yang | G11C 16/32 |

FOREIGN PATENT DOCUMENTS

TW   I529727   4/2016

* cited by examiner

*Primary Examiner* — Mohammed A Bashar
(74) *Attorney, Agent, or Firm* — JCIPRNET

(57) ABSTRACT

A block erase method for a flash memory is provided. The block erase method is to perform block erase on a block with a predetermined block size. The block erase method includes: performing an erase verification on bytes byte-by-byte in the block when performing the block erase; checking an erase step of the byte when the byte does not pass the erase verification; when the erase step of the byte exceeds a predetermined threshold value, performing the block erase with a partitioned block smaller than the predetermined block size, and returning to an erase verification stage to perform the erase verification; and when the erase step of the bytes does not exceed the predetermined threshold value, continuing to perform the block erase with the predetermined block size, and returning to the erasure verification stage to continue to perform the erase verification.

20 Claims, 3 Drawing Sheets

METHOD FOR ERASING FLASH MEMORY

CROSS-REFERENCE TO RELATED APPLICATION

This application claims the priority benefit of Taiwan application serial no. 111106910, filed on Feb. 25, 2022. The entirety of the above-mentioned patent application is hereby incorporated by reference herein and made a part of this specification.

BACKGROUND

Technical Field

The present invention relates to a method for erasing a memory, and more particularly, to a method for erasing a flash memory.

Description of Related Art

When erasing the flash memory, the erase operation is performed to erase the entire flash memory in one time block by block. For example, a block erase is performed in units of blocks with a size of 64K. Due to limitations of process uniformity or defects, each memory cell is different, and tailing bits are generated during the erase operation. These tailing bits cause slow erase, which in turn causes erase verification fail. When the erase verification fails, the memory needs to perform the block erase again.

Therefore, when performing the erase for the entire memory by using the block erase method, because it is easy to be affected by the tailing bits during the erase operation, some memory cells in the block will be subject to excessive erase, and the stress on the tunnel oxide layer is excessively increased, this leads to the reliability problem of the tunnel oxide layer, for example, the durability and retention of data.

Therefore, it is necessary to develop a method, which can avoid over erase and reduce the erasing time when performing the block erase on the flash memory.

SUMMARY

In view of the above description, according to one embodiment of the present invention, a block erase method for flash memory is provided. The block erase method is to perform a block erase on a block of the flash memory, and the block has a predetermined block size. The block erase method comprises: setting the predetermined block as M partitioned blocks, wherein each block size of the M partitioned blocks is smaller than the predetermined block size; setting M erase step threshold values within a maximum erase step to generate (M+1) erase step determining intervals; performing an erase verification on bytes byte-by-byte in each of the M partitioned blocks when performing the block erase; when the byte does not pass the erase verification, checking an erase step of the byte; determining which a specific interval among the (M+1) erase step determining intervals the erase step is therein; and performing the block erase on the partitioned blocks corresponding to the specific interval, returning to an erase verification stage to perform the erase verification after the block erase is completed. In a case that the erase step is less than or equal to a first erase step threshold value and in a first erase step determining interval, the block erase is performed by using the predetermined block size. In a case that the erase step is in a j-th ($2 \leq j \leq M+1$) erase step determining interval, the block erase is performed by using a block size of a (j−1)-th partitioned block.

According to one embodiment, in the block erase method for flash memory, when the byte passes the erase verification, erasing and performing the erase verification on a next byte until the block erase of the predetermined block size is completed.

According to one embodiment, in the block erase method for flash memory, the block size of the M partitioned blocks is adjustable.

According to one embodiment, in the block erase method for flash memory, a number of the M partitioned blocks is adjustable.

According to one embodiment, in the block erase method for flash memory, the M erase step threshold values are adjustable within the maximum erase step.

According to one embodiment, in the block erase method for flash memory, the flash memory is a NOR type flash memory.

According to another embodiment of the present invention, a block erase method for flash memory is provided. The block erasing method is to perform a block erase on a block of the flash memory, and the block has a predetermined block size. The block erase method comprises: performing an erase verification on bytes byte-by-byte in the block when performing the block erase; checking an erase step of the byte when the byte does not pass the erase verification; when the erase step of the byte exceeds a predetermined threshold value, performing the block erase with a partitioned block smaller than the predetermined block size, and returning to an erase verification stage to perform the erase verification; and when the erase step of the bytes does not exceed the predetermined threshold value, continuing to perform the block erase with the predetermined block size, and returning to the erasure verification stage to continue to perform the erase verification.

According to one embodiment, in the block erase method for flash memory, when the byte passes the erase verification, erasing and performing the erase verification on a next byte until the block erase of the predetermined block size is completed.

According to one embodiment, in the block erase method for flash memory, the erase step is less than a maximum erase step and adjustable.

According to one embodiment, in the block erase method for flash memory, a size of the partitioned block is adjustable.

According to one embodiment, in the block erase method for flash memory, the flash memory is a NOR type flash memory.

According to the embodiments of the present invention, overwriting of erasing/programming can be reduced to improve product reliability. In addition, according to the embodiment of the present invention, the erasing and writing time of the entire memory can also be reduced.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
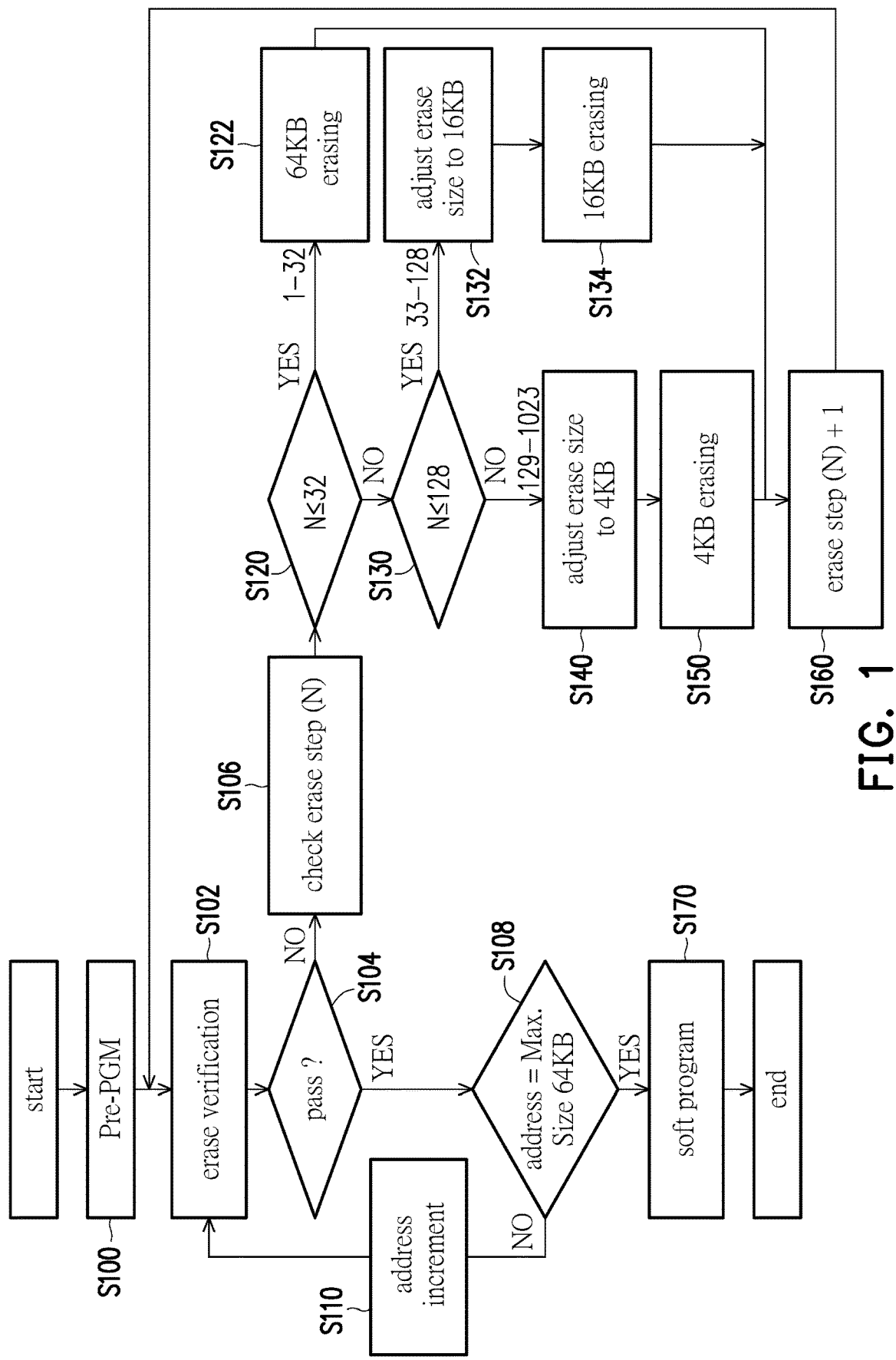
FIG. 1 is a schematic diagram illustrating an overall flow of an erase operation according to one embodiment of the present invention.

FIG. 1 is a schematic diagram illustrating an overall flow of an erase operation according to one embodiment of the present invention. As shown in FIG. 1, the entire erasing operation includes the pre-programming step S100 in the previous stage, the block erase operation, and the soft programming step S170 in the later stage. The erase operation of the embodiment of the present invention is a new block erase method.

As shown in FIG. 1, when starting to erase the flash memory, the step S100 of pre-programming will be performed first. Usually before the erase operation, a so-called pre-programming is performed. The pre-programming can make the threshold voltage Vt of the memory cells after being erased to be distributed more closely without being too widely distributed. Therefore, the distribution of the threshold voltage Vt of the memory cell can be programmed to a tighter state before perform the erase operation. This step is also a part of the existing block erase operation for flash memory, so it will not be described in detail here.

Next, steps S102, S104 and S108 are performed, and these steps are block erase in the entire erase operation. In this embodiment, the block size of 64 KB is used as an example. When performing the block erase, the block is erased byte by byte. In step S102, an erase verification is performed on a byte.

Next, in step S104, it determines whether the byte passes the erase verification or not, and if the byte passes the erase verification, then step S108 is performed to determine whether the current address reaches 64 KB. If the address has reached 64 KB, it means that the block has been erased. Next, the soft programming of step S170 is performed. The soft programming in step S170 is mainly to make the erase state of the memory block whose block erase has been completed becomes a tighter state close to the Gaussian distribution, so as to avoid the tailing bit effect. The soft programming can reduce overerased bits and also reduce leakage current. The soft programming in step S170 may include, for example, byte-by-byte soft program and refresh program, etc., it is an existing method of erasing a flash memory block, so it will not be described in detail here.

On the contrary, if it determines that the current address has not reached 64 KB in step S108, then in step S100, the address of the memory block is incremented (for example, incremented by 1, etc.) and the process returns to step S104, the erase operation and erase verification are performed on the next byte until the entire 64 KB block completes the block erase.

Next, the method of the partitioned block erase operation of the present invention will be described. When it determines that the byte fails to pass the erase verification in step S104, the erase step N of the byte is checked in step S106. In general, multiple loops may be performed to pass the erase verification when erasing the byte. In the related art, the erase verification is performed until passed. Therefore, it may take a long time for the block erase of the entire 64 KB to pass the erase verification.

According to the embodiment of the present invention, the control circuit of the flash memory checks the erase step N of the byte, and divides the size of the block erase of the memory based on the erase step N. That is, when the erase step is too many, the size of the block will be adjusted, and the block erase will be performed with a smaller block size. Thereby, the over erase and the erasing time of the memory cells can be reduced.

Here, the erase step N can be adjusted according to requirements, for example, the current maximum erase step can be 1024, and the user can set the threshold value from 1024, such as 4, 8, 16, 32, 64, 128, 256 . . . etc. In addition, the maximum erase step N is not limited to 1024, and this value can be set according to the actual conditions of product, which is not specifically limited in the present invention. In this embodiment, two threshold values (32 and 128 in FIG. 1) are set for explanation, but the actual application is not limited to two threshold values.

In addition, according to the embodiment of the present invention, the partition levels of the partitioned block erase, that is, the number of partitioned blocks, can also be set by the designer (user). In addition, the size of the partition region can also be set by the designer (user). For example, 4, 16, 32, 64, or 128, etc. can be set based on 256 KB. In the following embodiments, 3 levels are used as an example of the partition levels and 16 KB and 4 KB are used as an example for the size of the partition region, but this is not intended to limit the implementation of the present invention.

As shown in FIG. 1, when it determines that the byte fails to pass the erase verification in step S104, the erase step N of the byte is checked in step S106. Next, step S120 determines whether the erase step N of the byte is less than or equal to the first threshold value of the erase step (32 in this example, and the erase step N is between 1 and 32). If the erase step N is less than or equal to 32, it means that there is no problem of over erase. At this time, step S122 is performed, and the current 64 KB block erase is still performed; that is, the size of the current block erase is maintained. Next, in step S106, the erase step N is increased by 1, and the process returns to step S102 to continue the erase operation and the erase verification.

In addition, if it determines in step S230 that the erase step N is greater than 32, the process proceeds to step S130 to further determine whether the erase step N is less than or equal to the second threshold value of the erase step (128 in this example). If the erase step N is less than or equal to 128, that is, the erase step N is between 33 and 128, the process proceeds to step S132. In step S132, the control circuit adjusts the size of the block erase from the current 64 KB to a smaller first partitioned block size, which is 16 KB in this example. Next, in step S134, an erase operation for 16 KB is performed. Next, in step S106, the erase step N is increased by 1, and the process returns to step S102 to continue the erase operation and the erase verification.

In addition, if the erase step N is greater than 128, that is, the erase step N is between 129 and 1023, the process proceeds to step S140. In step S140, the control circuit adjusts the size of the block erase from the current 16 KB to a smaller second partitioned block size, which is 4 KB in this example. Next, in step S134, an erase operation for 4 KB is performed. Next, in step S106, the erase step N is increased by 1, and the process returns to step S102 to continue the erase operation and the erase verification.

In the above embodiment, two partitioned blocks and two threshold values of erase step are used for explanation, but a greater number of the partitioned blocks can be adjusted, and the threshold values of erase step can also be adjusted correspondingly.

For example, the control circuit of the flash memory may further set M partitioned blocks, and the block size of each of these partitioned blocks is smaller than the predetermined block size (i.e., 64 KB in the above example). If the above two partitioned blocks are taken as an example, the block sizes of the partitioned blocks are 16 KB and 4 KB.

In addition, the control circuit may further set M threshold values of erase step within the maximum erase step (such as 1024 described above) to generate (M+1) erase step determining intervals. If the two threshold values of erase step described above are taken as an example, the first threshold value of the erase step is 32 and the second threshold value of the erase step is 128, and the first erase step determining interval is 0~32, the second erase step determining interval is 33~128 and the third erase step determining interval is 129~1023.

In addition, when the erase verification in step S102 fails, the erase step of the byte is checked, and in step S106 it determines which specific interval among the (M+1) erase step determining intervals the erase step is therein. For example, in steps S120 and S130, it determines in which specific interval among the 3 erase step determining intervals 0~32, 33~128, and 129~1023 the erase step is therein. Next, the block erase is performed on the blocks corresponding to the specific interval, and then return to the erase verification to continue to perform the erase verification in step S102. In the above example of FIG. 1, when the erase step is in the first erase step determining interval (i.e., 0~32) that is below the first erases step threshold value (i.e., 32), the predetermined block size is used to perform the block erase. Namely, in step S122, the original 64 KB is used for performing the block erase.

In addition, when the erase step N is in the j-th ($2 \leq j \leq M+1$) erase step determining interval, the block erase is performed using the block size of the (j−1)-th partitioned block. For example, when step S130 is determined as "Yes", the erase step N is in the second erase step determining interval (33~128), and at this time, the first partitioned block (i.e., 16 KB) is used for performing the block erase (as in step S132). For example, when step S130 is determined as "No", the erase step N is in the third erase step determining interval (129~1023), and the second partitioned block (i.e., 4 KB) is used for performing the block erase (as in step S150).

As described above, in the partitioned block erase of the embodiment, the number of the partitioned blocks, the size of the partitioned blocks and the corresponding threshold values of erase step can be adjusted on demands. In this way, overwriting of erasing/programming can be reduced to improve product reliability. In addition, according to the embodiment of the present invention, the erasing and writing time of the entire memory can also be reduced.

Figure 2A:
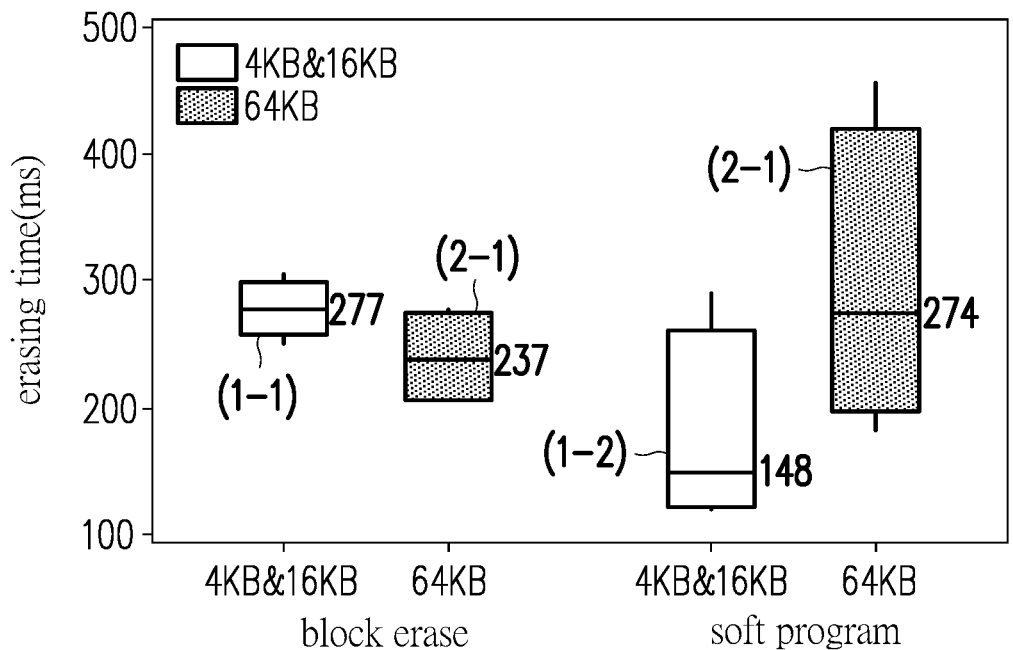
FIG. 2A and FIG. 2B are diagrams showing the comparison of erasing time between the embodiment of the present invention and the related art.
Figure 2B:
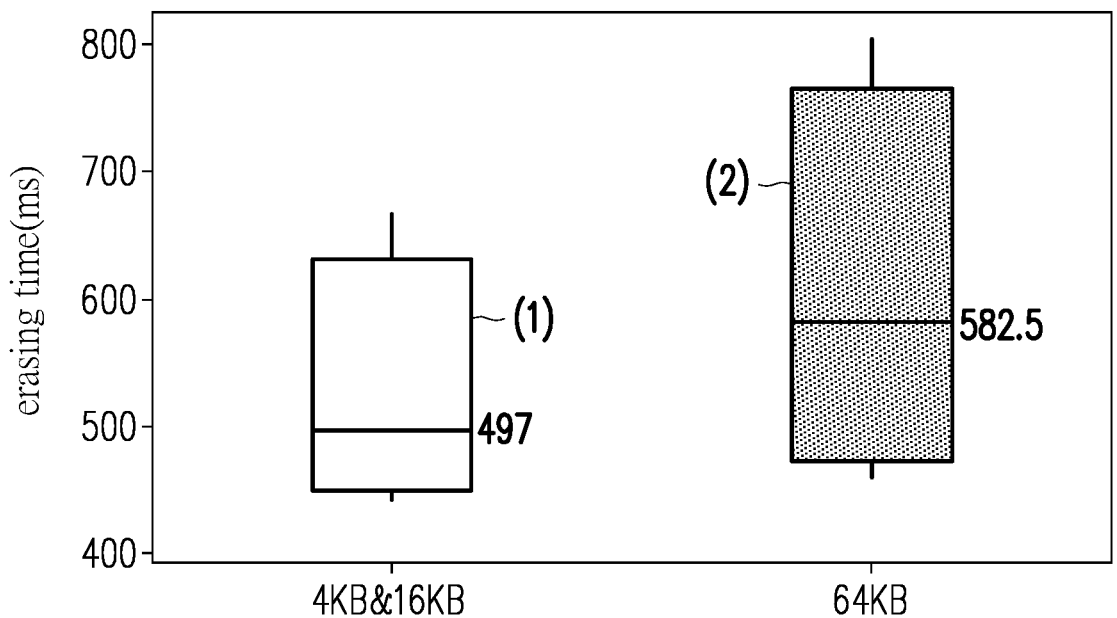

FIG. 2A and FIG. 2B are diagrams showing the comparison of erasing time between the embodiment of the present invention and the related art. FIG. 2A shows the experimental results of the erasing time of the pure block erase stage and the soft programming stage of the present invention and the related, respectively. As shown in FIG. 2A, the result (1-1) represents the erasing time of the partitioned block erase of the present invention, that is, the erasing time by using the partitioned blocks 16 KB and 4 KB as shown in FIG. 1. The result (1-2) is the erasing time corresponding to the soft programming stage of the partitioned block erase. In addition, the result (2-1) represents the erasing time of the ordinary block erase in the related art, and the result (2-2) is the erasing time of the soft programming stage of the corresponding ordinary block erase.

As can be seen from FIG. 2A, the method of the partitioned block erase of the embodiment will check the erase step to reduce the size of the block erase. Although the erasing time (such as (1-1)) in the pure block erase stage is slightly longer than erasing time of the pure block erase of the related art (such as (2-1)), however, compared with the related soft-programmed erasing time of the related art (such as (2-2)), the erasing time for the soft programming (such as (1-2)) in the latter stage of block erase is significant reduced according to the embodiment.

FIG. 2B is a schematic diagram of test results of the overall erasing time of the memory according to the embodiment of the present invention and the related art. As shown in FIG. 2B, the result (1) is the overall erasing time using the partitioned block erase according to the embodiment of the present invention, and the result (2) is the overall erasing time using the ordinary block erase of the related art. From the results, compared with the conventional method, the overall erasing time by using the partitioned block erase of the embodiment of the present invention is significant reduced.

In summary, the embodiments of the present invention perform multiple erase verifications (such as checking the erase step) when performing block erase on the memory, and this slightly increases the erasing time for performing the pure block erase. However, after this step, the subsequent soft programming time can be shortened, so the overall erasing time can be reduced. Moreover, if the erase verification is not passed, the erase step will be further checked. If the erase step exceeds the preset threshold value, the erasing is performed with smaller partitioned blocks, so that the over erase of the bytes that are not necessary to be erased again can be reduced.

Figure 3:
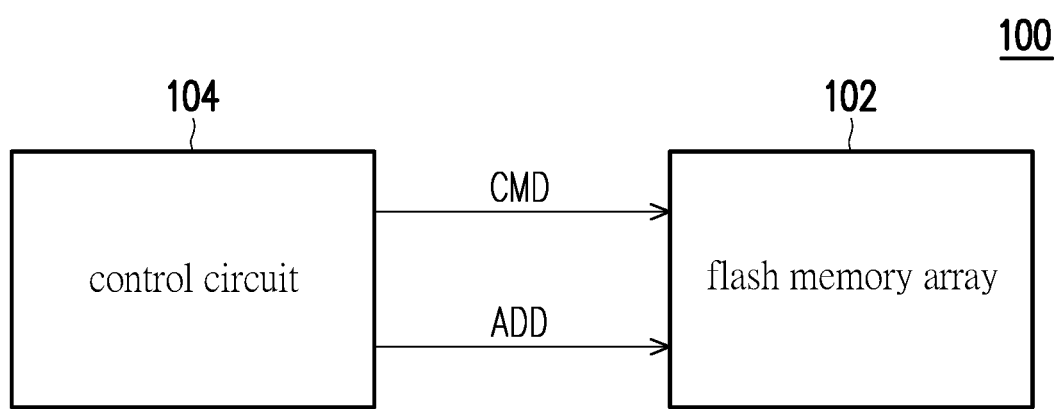
FIG. 3 is a schematic circuit configuration diagram of a flash memory according to one embodiment of the present invention.

FIG. 3 is a schematic circuit configuration diagram of a flash memory according to an embodiment of the present invention. The flash memory 100 comprises at least a flash memory array 102 and a control circuit (control logic) 104. The flash memory may also comprise components such as column decoders, row decoders, high voltage generators, page address latches/counters, page buffers, etc., which are not particularly different from the existent flash memory configuration, those skilled in the art can arbitrarily make modifications and changes.

The control circuit 104 can control the memory cells (specified byte, block, page, etc.) through the command line CMD and the address line ADD. The control circuit 104 can transmit program, erase or read commands to the flash memory array 102 through the command line CMD. After the control circuit 104 transmits the erase command via the command line CMD, addressing the memory cells of the flash memory, setting the block size, and partitioning the block size, etc. can be performed according to the erase method of the flash memory as shown in FIG. 1. The operations of performing the partitioned block erase by the control circuit 104 are described in the description of FIG. 1, and will not be repeated here.

In addition, the above example is described with NOR-type flash memory, but it can also be applied to other memories using the block erase, such as NAND-type flash memory and the like. The present invention does not specifically limit the type of flash memory.

In summary, according to the embodiments of the present invention, overwriting of erasing/programming can be reduced, so as to improve product reliability. In addition, according to the embodiment of the present invention, the erasing and writing time of the entire memory can also be shortened.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A block erase method for flash memory, wherein the block erase method is to perform a block erase on a block of the flash memory, and the block has a predetermined block size, the block erase method comprising:
    setting the block to have M partitioned blocks, wherein each block size of the M partitioned blocks is smaller than the predetermined block size;
    setting M erase step threshold values within a maximum erase step to generate (M+1) erase step determining intervals;
    performing an erase verification on bytes byte-by-byte in each of the M partitioned blocks when performing the block erase;
    when the byte does not pass the erase verification, checking an erase step of the byte;
    determining which a specific interval among the (M+1) erase step determining intervals the erase step is therein; and
    performing the block erase on the partitioned blocks corresponding to the specific interval, returning to an erase verification stage to perform the erase verification after the block erase is completed,
    wherein in a case that the erase step is less than or equal to a first erase step threshold value and in a first erase step determining interval, the block erase is performed by using the predetermined block size, and
    in a case that the erase step is in a j-th ($2 \leq j \leq M+1$) erase step determining interval, the block erase is performed by using a block size of a (j−1)-th partitioned block.

2. The block erase method for flash memory according to claim 1, when the byte passes the erase verification, erasing and performing the erase verification on a next byte until the block erase of the predetermined block size is completed.

3. The block erase method for flash memory according to claim 1, wherein the block size of the M partitioned blocks is adjustable.

4. The block erase method for flash memory according to claim 1, wherein a number of the M partitioned blocks is adjustable.

5. The block erase method for flash memory according to claim 1, wherein the M erase step threshold values are adjustable within the maximum erase step.

6. The block erase method for flash memory according to claim 1, wherein the flash memory is a NOR type flash memory.

7. The block erase method for flash memory according to claim 1, wherein the flash memory is a NAND type flash memory.

8. A block erase method for flash memory, wherein the block erasing method is to perform a block erase on a block of the flash memory, and the block has a predetermined block size, the block erase method comprising:
    performing an erase verification on bytes byte-by-byte in the block when performing the block erase;
    checking an erase step of the byte when the byte does not pass the erase verification;
    when the erase step of the byte exceeds a predetermined threshold value, performing the block erase with a partitioned block smaller than the predetermined block size, and returning to an erase verification stage to perform the erase verification; and
    when the erase step of the bytes does not exceed the predetermined threshold value, continuing to perform the block erase with the predetermined block size, and returning to the erasure verification stage to continue to perform the erase verification.

9. The block erase method for flash memory according to claim 8, wherein when the byte passes the erase verification, erasing and performing the erase verification on a next byte until the block erase of the predetermined block size is completed.

10. The block erase method for flash memory according to claim 8, wherein the erase step is less than a maximum erase step and adjustable.

11. The block erase method for flash memory according to claim 8, wherein a size of the partitioned block is adjustable.

12. The block erase method for flash memory according to claim 8, wherein the flash memory is a NOR type flash memory.

13. The block erase method for flash memory according to claim 8, wherein the flash memory is a NAND type flash memory.

14. A flash memory, comprising:
    a flash memory array; and
    a control circuit, coupled to the flash memory array to control operations of the flash memory array,
    wherein when erasing the flash memory, the control circuit is configured to perform
    setting the block to have M partitioned blocks, wherein each block size of the M partitioned blocks is smaller than the predetermined block size;
    setting M erase step threshold values within a maximum erase step to generate (M+1) erase step determining intervals;
    performing an erase verification on bytes byte-by-byte in each of the M partitioned blocks when performing the block erase;
    when the byte does not pass the erase verification, checking an erase step of the byte;
    determining which a specific interval among the (M+1) erase step determining intervals the erase step is therein; and
    performing the block erase on the partitioned blocks corresponding to the specific interval, returning to an erase verification stage to perform the erase verification after the block erase is completed,
    wherein in a case that the erase step is less than or equal to a first erase step threshold value and in a first erase step determining interval, the block erase is performed by using the predetermined block size, and
    in a case that the erase step is in a j-th ($2 \leq j \leq M+1$) erase step determining interval, the block erase is performed by using a block size of a (j−1)-th partitioned block.

15. The flash memory according to claim 14, when the byte passes the erase verification, erasing and performing the erase verification on a next byte until the block erase of the predetermined block size is completed.

16. The flash memory according to claim 14, wherein the block size of the M partitioned blocks is adjustable.

17. The flash memory according to claim 14, wherein a number of the M partitioned blocks is adjustable.

18. The flash memory according to claim 14, wherein the M erase step threshold values are adjustable within the maximum erase step.

19. The flash memory according to claim 14, wherein the flash memory is a NOR type flash memory.

20. The flash memory according to claim 14, wherein the flash memory is a NAND type flash memory.

* * * * *